(12) United States Patent
Ham

(10) Patent No.: US 11,271,258 B2
(45) Date of Patent: Mar. 8, 2022

(54) BATTERY PACK

(71) Applicant: LG Chem, Ltd., Seoul (KR)

(72) Inventor: Sang-Hyeok Ham, Daejeon (KR)

(73) Assignee: LG Energy Solution, Ltd.

( * ) Notice: Subject to any disclaimer, the term of this patent is extended or adjusted under 35 U.S.C. 154(b) by 198 days.

(21) Appl. No.: 16/609,244

(22) PCT Filed: Nov. 29, 2018

(86) PCT No.: PCT/KR2018/014984
§ 371 (c)(1),
(2) Date: Oct. 29, 2019

(87) PCT Pub. No.: WO2019/107982
PCT Pub. Date: Jun. 6, 2019

(65) Prior Publication Data
US 2020/0052352 A1 Feb. 13, 2020

(30) Foreign Application Priority Data
Nov. 29, 2017 (KR) .......................... 10-2017-0162226

(51) Int. Cl.
H02J 7/00 (2006.01)
H01M 10/46 (2006.01)
(Continued)

(52) U.S. Cl.
CPC ........... *H01M 10/46* (2013.01); *H01M 10/48* (2013.01); *H01M 50/20* (2021.01); *H02J 7/007* (2013.01)

(58) Field of Classification Search
USPC ....................................................... 320/107
See application file for complete search history.

(56) References Cited

U.S. PATENT DOCUMENTS 7,368,829 B2 5/2008 Tezuka
2012/0191294 A1 7/2012 Boiron et al.
(Continued)

FOREIGN PATENT DOCUMENTS

CN 102511009 A 6/2012
CN 105137336 A 12/2015
(Continued)

OTHER PUBLICATIONS

Extended European Search Report with Written Opinion for Application No. EP18884645.5 dated May 4, 2020, 7 pages.
(Continued)

*Primary Examiner* — Bryce M Aisaka
(74) *Attorney, Agent, or Firm* — Lerner, David, Littenberg, Krumholz & Mentlik, LLP

(57) ABSTRACT

A battery pack including first and second battery contactors respectively having first ends electrically connected to positive and negative electrode terminals of a battery; first and second charging contactors respectively having first ends electrically connected to second ends of the first and second battery contactors; a second power connector of a charger having first and second output terminals respectively electrically connected to the first and second input terminals being connected to the first power connector; and a control unit configured to, when a charging voltage is applied from a power source of the charger to the battery pack between the first output terminal and the second output terminal, control at least one of the first charging contactor and the second charging contactor to change between a turn-on state and a turn-off state to diagnose a fault of each of the first charging contactor and the second charging contactor.

9 Claims, 7 Drawing Sheets

(51) Int. Cl.
*H01M 10/48* (2006.01)
*H01M 50/20* (2021.01)

(56) References Cited

U.S. PATENT DOCUMENTS

| | | | |
|---|---|---|---|
| 2013/0176042 A1* | 7/2013 | Huh | G01N 27/04 324/693 |
| 2014/0028322 A1 | 1/2014 | Tzivanopoulos | |
| 2016/0072320 A1 | 3/2016 | Kanda | |
| 2016/0146901 A1 | 5/2016 | Ohta | |
| 2016/0243954 A1 | 8/2016 | Moro et al. | |
| 2017/0244239 A1 | 8/2017 | Jin et al. | |
| 2018/0131178 A1 | 5/2018 | Shimomura et al. | |
| 2019/0011504 A1* | 1/2019 | Kim | G01R 27/025 |

FOREIGN PATENT DOCUMENTS

| | | |
|---|---|---|
| DE | 102011004516 A1 | 8/2012 |
| DE | 102013213288 A1 | 1/2015 |
| DE | 102015008467 A1 | 1/2016 |
| JP | 2006136161 A | 5/2006 |
| JP | 2008037211 A | 2/2008 |
| JP | 2011066985 A | 3/2011 |
| JP | 2011160604 A | 8/2011 |
| JP | 2012115045 A | 6/2012 |
| JP | 2013500548 A | 1/2013 |
| JP | 2014139058 A | 7/2014 |
| JP | 2014207766 A | 10/2014 |
| JP | 2015095934 A | 5/2015 |
| JP | 2016010263 A | 1/2016 |
| JP | 2016100983 A | 5/2016 |
| JP | 2016101033 A | 5/2016 |
| JP | 2016119762 A | 6/2016 |
| JP | 2017079496 A | 4/2017 |
| KR | 20060014029 A | 2/2006 |
| KR | 20130051228 A | 5/2013 |
| KR | 20160054935 A | 5/2016 |
| KR | 101716886 B1 | 3/2017 |
| KR | 20170099672 A | 9/2017 |
| KR | 20170139102 A | 12/2017 |
| WO | 2016185579 A1 | 11/2016 |

OTHER PUBLICATIONS

International Search Report from PCT/KR2018/014984, dated Mar. 28, 2019, 2 pages.

* cited by examiner

BATTERY PACK

CROSS-REFERENCE TO RELATED APPLICATIONS

The present application is a national phase entry under 35 U.S.C. § 371 of International Application No. PCT/KR2018/014984 filed Nov. 29, 2018, published in Korean, which claims priority from Korean Patent Application No. 10-2017-0162226 filed Nov. 29, 2017, all of which are incorporated herein by reference.

TECHNICAL FIELD

The present disclosure relates to a battery pack, and more particularly, to a battery pack for diagnosing a fault of a charging contactor based on a voltage applied to a measurement resistor connected to the charging contactor.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Secondary batteries commercially available at the present include nickel-cadmium batteries, nickel hydrogen batteries, nickel-zinc batteries, lithium secondary batteries and the like. Among them, the lithium secondary batteries are in the limelight since they have almost no memory effect compared to nickel-based secondary batteries and also have very low self-discharging rate and high energy density.

In particular, the battery pack includes a battery module in which a plurality of battery cells are electrically connected, thereby meeting a high-capacity and high-power design required for an electric vehicle. The battery pack applied to an electric vehicle may be electrically connected to a charger of a charging station to charge the electric power.

To this end, the battery pack applied to an electric vehicle may include a battery contactor connected to a positive electrode terminal and a negative electrode terminal of the battery module to control the electrical connection of the output terminals of the battery module, and a charging contactor for controlling the electrical connection between the battery contactor and a charging terminal to which the power of the charger is input.

In particular, it is important that the charging contactor is exposed to the outside and also controls the electrical connection of an input terminal connected to a power connector of the charger in order to monitor whether the charging contactor is currently in a turn-on state or a turn-off state and to determine whether the charging contactor is actually controlled in response to the control to the turn-on state or the turn-off state.

DISCLOSURE

Technical Problem

The present disclosure is designed to solve the problems of the related art, and therefore the present disclosure is directed to providing a battery pack, which may diagnose a fault of each of a first charging contactor and a second charging contactor by controlling the first charging contactor and the second charging contactor, when a first power connector of the battery pack and a second power connector of a charger are connected and a charging voltage of the charger is applied between a first output terminal and a second output terminal of the second power connector.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery pack, comprising: a first battery contactor, wherein a first end of the first battery connector is configured to be electrically connected to a positive electrode terminal of a battery; a second battery contactor, wherein a first end of the second battery connector is configured to be electrically connected to a negative electrode terminal of the battery; a first charging contactor, wherein a first end of the first charging contactor is electrically connected to a second end of the first battery contactor; a second charging contactor, wherein a first end of the first charging contactor is electrically connected to a second end of a second end of the second battery contactor; a first measurement resistor electrically connected between a first node located at the first end of the second charging contactor and a second node located at the first end of the first charging contactor; a second measurement resistor electrically connected between the first node and a third node located at a second end of the first charging contactor; a third measurement resistor electrically connected between the first node and a fourth node located at a second end of the second charging contactor; a first power connector having a first input terminal electrically connected to the second end of the first charging contactor and a second input terminal electrically connected to the second end of the second charging contactor; and a control unit configured to, when first and second output terminals of a second power connector of a charger are electrically connected to the first input terminal and the second input terminal of the first power connector, respectively, and a charging voltage is being applied from a power source of the charger to the battery pack between the first output terminal and the second output terminal, control at least one of the first charging contactor or the second charging contactor to change from a turn-on state to a turn-off state; and diagnose a fault of each of the first charging contactor and the second charging contactor based on at least one of a first measured voltage measured across the first measurement resistor, a second measured voltage measured across the second measurement resistor or a third measured voltage measured across the third measurement resistor.

Preferably, when a charging start request signal is received, the control unit may be configured to control the first charging contactor to change from the turn-off state to the turn-on state and determine whether the first charging contactor has a turn-on fault based on a measured voltage difference between the first measured voltage and the second measured voltage that are measured while the first charging contactor is in the turn-off state.

Preferably, when the measured voltage difference is equal to or greater than a first reference voltage, the control unit may be configured to determine that a turn-on fault occurs at the first charging contactor.

Preferably, when a charging start request signal is received, the control unit may be configured to control the first charging contactor to change from the turn-on state to the turn-off state and determine whether the first charging contactor has a turn-off fault based on a measured voltage difference between the first measured voltage and the second measured voltage that are measured while the first charging contactor is in the turn-off state.

Preferably, when the measured voltage difference is less than a first reference voltage, the control unit may be configured to determine that a turn-off fault occurs at the first charging contactor.

Preferably, when a charging start request signal is received, the control unit may be configured to determine whether the first charging contactor has a fault based on a measured voltage difference between the first measured voltage and the second measured voltage, and when it is determined that the first charging contact does not have a fault, the control unit may be configured to control the second charging contactor to change from the turn-off state to the turn-on state, and determine whether the second charging contactor has a turn-on fault based on the third measured voltage that is measured while the second charging contactor is in the turn-on state.

Preferably, when the third measured voltage is equal to or greater than a second reference voltage, the control unit may be configured to determine that a turn-on fault occurs at the second charging contactor.

Preferably, when it is determined that a fault occurs in at least one of the first charging contactor and the second charging contactor, the control unit may be configured to stop charging the battery from the power source of the charger.

In another aspect of the present disclosure, there is also provided a vehicle, comprising the battery pack of any of the embodiments described herein.

Advantageous Effects

According to at least one of the embodiments of the present disclosure, it is possible to check a turn-on control of a contactor since a first power connector of the battery pack and a second power connector of a charger are connected before the battery pack is charged and also since it is determined whether the first charging contactor and the second charging contactor have a turn-on fault by controlling the first charging contactor and the second charging contactor before a charging voltage is applied to a first output terminal and a second output terminal of the second power connector.

The effects of the present disclosure are not limited to the above, and other effects not mentioned herein may be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a battery pack 100 device according to an embodiment of the present disclosure will be described.

Figure 1:
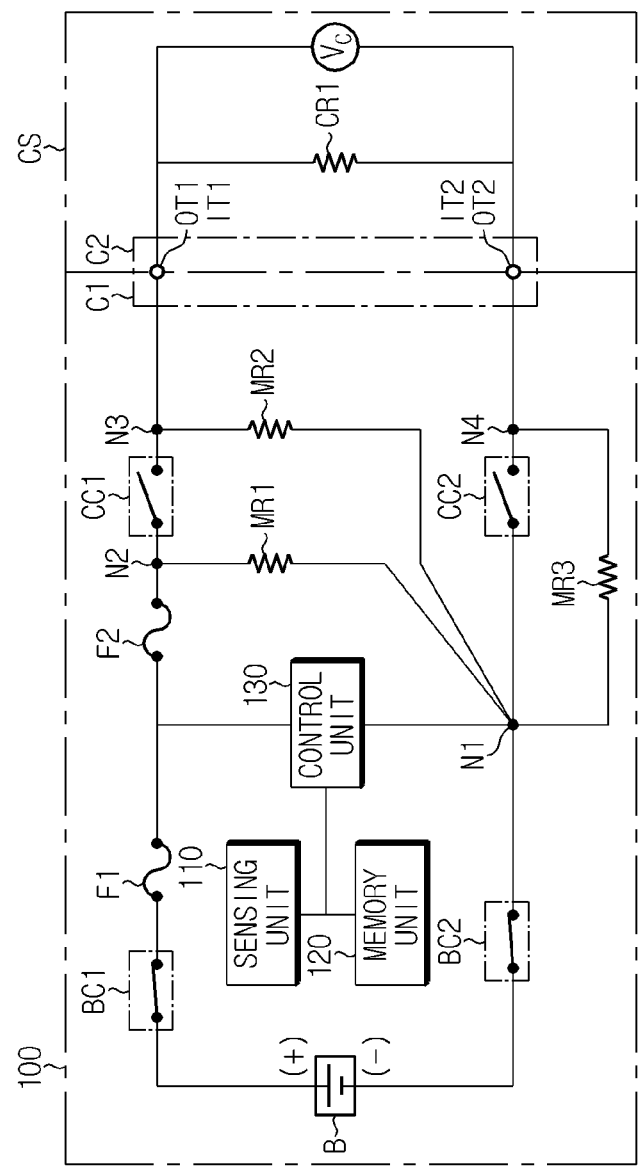
FIGS. 1 to 3 are diagrams showing a functional configuration of a battery pack according to embodiments of the present disclosure and a charger.
Figure 2:
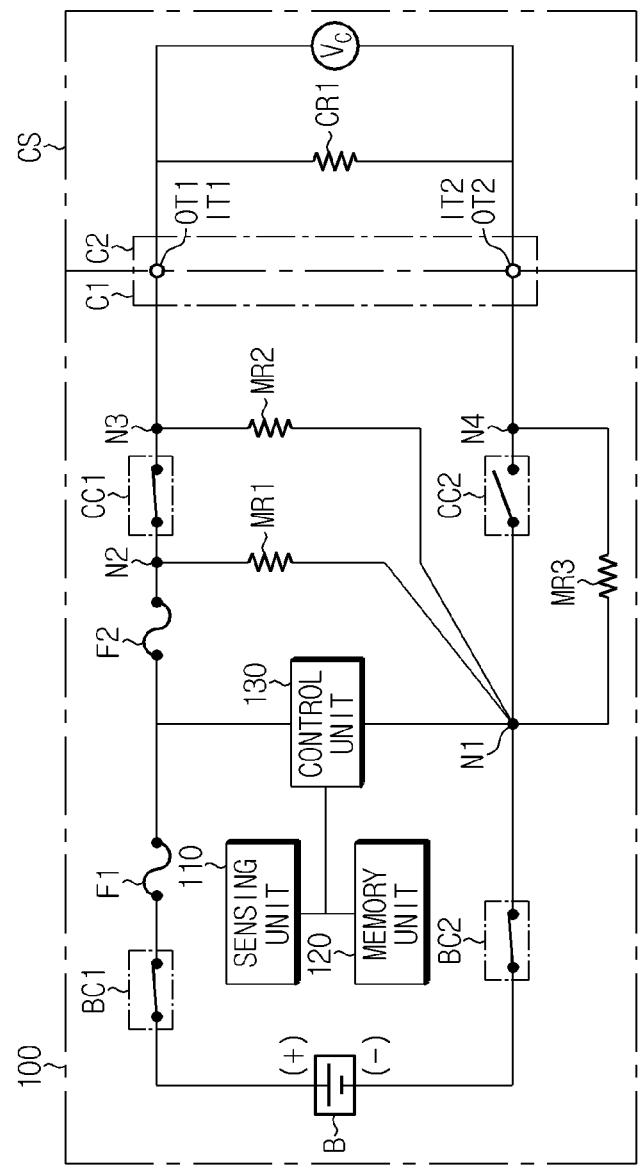
Figure 3:
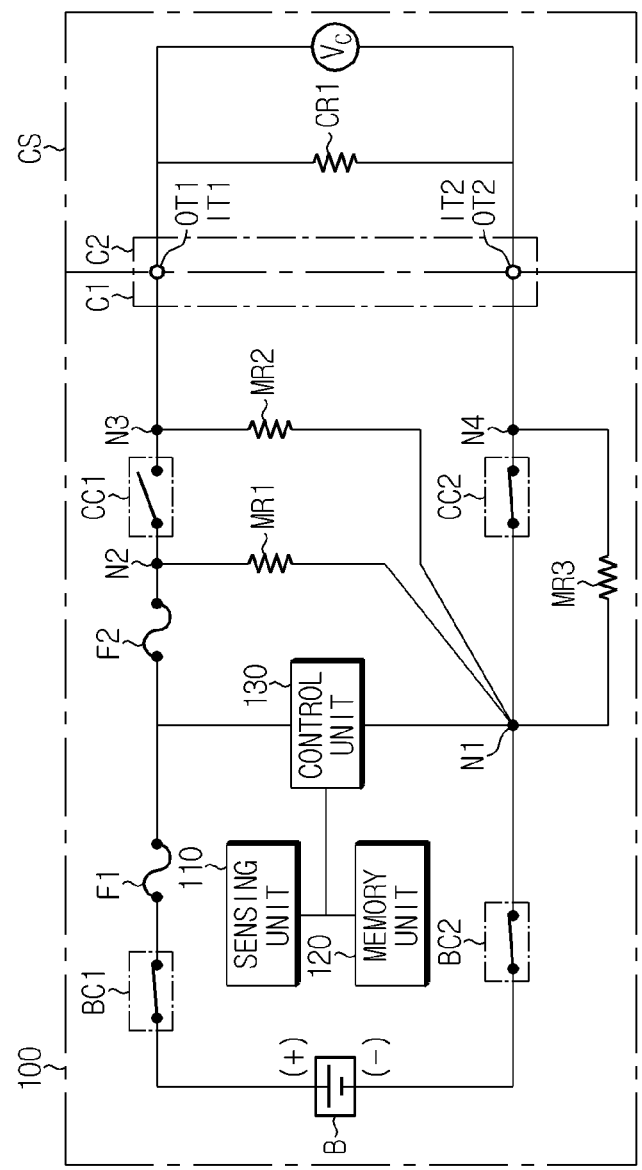

FIGS. 1 to 3 are diagrams showing a functional configuration of the battery pack 100 according to embodiments of the present disclosure and a charger CS.

First, referring to FIG. 1, the battery pack 100 includes a battery module B, a first battery contactor BC1, a second battery contactor BC2, a first charging contactor CC1, a second charging contactor CC2, a first measurement resistor MR1, a second measurement resistor MR2, a third measurement resistor MR3, a first power connector C1, a sensing unit 110, a memory unit 120 and a control unit 130.

The battery module B may include at least one battery cell. If the battery module B includes a plurality of battery cells electrically connected, the plurality of battery cells may be connected to each other in series, in parallel or in series and parallel. The battery module B has a positive electrode terminal (+) and a negative electrode terminal (−).

One end of the first battery contactor BC1 is electrically connected to the positive electrode terminal (+) of the battery module B, and one end of the second battery contactor BC2 is electrically connected to the negative electrode terminal (−) of the battery module B.

By doing so, the battery module B may output power or be charged according to a turn-on state or a turn-off state of the first battery contactor BC1 and the second battery contactor BC2.

The first battery contactor BC1 and the second battery contactor BC2 may be controlled into a turn-on state or a turn-off state by the control unit 130, explained later.

Here, the turn-on state means a state where a contact point of the contactor is in contact to make one end and the other end of the contactor be electrically connected. Also, the turn-off state means a state where the contact point of the contactor is separated to make one end and the other end of the contactor be electrically disconnected.

One end of the first charging contactor CC1 is electrically connected to the other end of the first battery contactor BC1, and one end of the second charging contactor CC2 is electrically connected to the other end of the second battery contactor BC2.

In addition, the other ends of the first charging contactor CC1 and the second charging contactor CC2 are electrically connected to the first power connector C1, respectively. More specifically, the other end of the first charging contactor CC1 is electrically connected to a first input terminal IT1 provided at the first power connector C1, and the other end of the second charging contactor CC2 is electrically connected to a second input terminal IT2 provided at the first power connector C1.

Meanwhile, if a second power connector C2 of the charger CS is connected to the first power connector C1, a first output terminal OT1 and a second output terminal OT2 of the second power connector C2 may be electrically connected to the first input terminal IT1 and the second input terminal IT2, respectively.

Accordingly, when the first battery contactor BC1, the second battery contactor BC2, the first charging contactor CC1 and the second charging contactor CC2 are in a turn-on state, if the second power connector C2 is connected to the first power connector C1, the power of the charger CS is supplied to charge the battery module B.

Meanwhile, a second node N2 and a third node N3 are located at one end and the other end of the first charging contactor CC1, respectively, and a first node N1 and a fourth node N4 are located at one end and the other end of the second charging contactor CC2, respectively.

At this time, the first measurement resistor MR1 is electrically connected between the first node N1 and the second node N2, and the second measurement resistor MR2 is electrically connected between the first node N1 and the third node N3. Also, the third measurement resistor MR3 is electrically connected between the first node N1 and the fourth node N4 and connected to the second charging contactor CC2 in parallel.

The sensing unit 110 is operatively coupled to the control unit 130. That is, the sensing unit 110 may be connected to the control unit 130 to transmit an electrical signal to the control unit 130 or to receive an electrical signal from the control unit 130.

The sensing unit 110 measures a battery voltage applied between the positive electrode terminal (+) and the negative electrode terminal (−) of the battery module B according to a preset cycle or the sensing control of the control unit 130.

Also, the sensing unit 110 measures a first measurement voltage, a second measurement voltage and a third measurement voltage applied to the first measurement resistor MR1, the second measurement resistor MR2 and the third measurement resistor MR3, respectively, according to the preset cycle or the sensing control of the control unit 130.

In addition, the sensing unit 110 measures a charging voltage Vc of the charger CS applied between the first input terminal IT1 and the second input terminal IT2 or between the first output terminal OT1 and the second output terminal OT2 according to the preset cycle or the sensing control of the control unit 130.

Also, the sensing unit 110 repeatedly measures the battery current flowing into or out of the battery module B.

After that, the sensing unit 110 may provide the measured signal representing the measured battery voltage, the first measurement voltage, the second measurement voltage, the third measurement voltage, the charging voltage Vc and the battery current to the control unit 130.

To this end, the sensing unit 110 includes a voltage sensor configured to measure the voltage of the battery module B. In addition, the sensing unit 110 may further include a current sensor configured to measure the current of the battery module B.

If the measured signal is received from the sensing unit 110, the control unit 130 may determine a digital value of each of the measured battery voltage, the first measurement voltage, the second measurement voltage, the third measurement voltage, the charging voltage Vc and the battery current, respectively, and store the digital value in the memory unit 120.

The memory unit 120 is a semiconductor memory device that records, erases and updates data generated by the control unit 130, and stores a plurality of program codes for diagnosing faults of the first charging contactor CC1 and the second charging contactor CC2, respectively. In addition, the memory unit 120 may store settings used when the present disclosure is implemented.

The memory unit 120 is not particularly limited as long as it is a semiconductor memory device known to be capable of recording, erasing and updating data. As one example, the memory unit 120 may be a dynamic random-access memory (DRAM), a synchronous dynamic random-access memory (SDRAM), a flash memory, a read-only memory (ROM), an electrically erasable programmable read-only memory (EEPROM), a register, or the like. The memory unit 120 may further include a storage medium storing program codes that define the control logic of the control unit 130. The storage medium includes a non-volatile storage element such as a flash memory or a hard disk. The memory unit 120 may be physically separated from the control unit 130 or may be integrated with the control unit 130.

The control unit 130 determines whether to perform a fault diagnosis of the first charging contactor CC1 and the second charging contactor CC2 based on a diagnosis condition.

Here, the diagnosis condition may include any one of whether the first power connector C1 and the second power connector C2 are coupled, whether the charging voltage Vc of the charger CS is applied between the first output terminal OT1 and the second output terminal OT2, whether the charging start request signal is received, and whether the first battery contactor BC1 and the second battery contactor BC2 are in a turn-on state.

As shown in FIG. 2, the control unit 130 according to an embodiment determines that the diagnosis condition is satisfied if the first power connector C1 and the second power connector C2 are coupled, the charging voltage Vc of the charger CS is applied between the first output terminal OT1 and the second output terminal OT2, the charging start request signal is received, and the first battery contactor BC1 and the second battery contactor BC2 are in the turn-on state.

Meanwhile, the charger CS may adopt any one of a CSS (Combined Charging System) standard, which outputs the charging voltage Vc to be applied between the first output terminal OT1 and the second output terminal OT2 when the first power connector C1 and the second power connector C2 are coupled, and a CHAdeMO standard, which does not output the charging voltage Vc even though the first power connector C1 and the second power connector C2 are coupled.

By using the above, the control unit 130 checks whether the charging voltage Vc of the charger CS is applied between the first output terminal OT1 and the second output terminal OT2, and then diagnoses a fault of the first charging contactor CC1 and the second charging contactor CC2 if the charging voltage Vc is not applied, as in the case where the charger CS adopts the CCS standard.

The control unit 130 checks whether a charging start request signal is received and diagnoses a fault of the first charging contactor CC1 and the second charging contactor CC2 just before the battery module B is charged. Namely, the control unit 130 determines whether the first charging contactor CC1 and the second charging contactor CC2 kept in the turn-off state just before the battery module B is charged may be controlled into the turn-on state in order to charge the battery module B.

If the diagnosis condition is satisfied, the control unit 130 determines that the first charging contactor CC1 and the second charging contactor CC2 are to be diagnosed. After that, the control unit 130 controls at least one of the first charging contactor CC1 and the second charging contactor CC2 into a turn-on state or a turn-off state and determines whether a fault occurs at each of the first charging contactor CC1 and the second charging contactor CC2 based on at least one of the first measured voltage, the second measured voltage and the third measured voltage measured according to the above control.

To this end, the control unit 130 is configured to generate a control signal for controlling at least one of the first battery contactor BC1, the second battery contactor BC2, the first charging contactor CC1 and the second charging contactor CC2 into a turn-on state or a turn-off state.

First, the control unit 130 controls only the first charging contactor CC1 into a turn-on state, among the first charging contactor CC1 and the second charging contactor CC2 which are in the turn-off state, as shown in FIG. 2, and determines a turn-on fault of the first charging contactor CC1 based on the measured voltage difference between the first measured voltage and the second measured voltage.

Here, the turn-on fault may mean a fault that a contactor maintains a turn-off state even though the control unit 130 controls the contactor to turn on.

If the measured voltage difference is equal to or greater than a first reference voltage, the control unit 130 may determine that a turn-on fault has occurred at the first charging contactor CC1.

Conversely, if the measured voltage difference is less than the first reference voltage, the control unit 130 may determine that a turn-on fault has not occurred at the first charging contactor CC1.

At this time, the control unit 130 calculates a theoretical value of the measured voltage difference between the first measured voltage and the second measured voltage corresponding to the case where the connector condition is a first connector condition in which the second power connector C2 having the first output terminal OT1 and the second output terminal OT2 to which the charging voltage Vc is not applied is coupled to the first power connector C1 and the contactor condition is a first contactor condition in which the first battery contactor BC1 and the second battery contactor BC2 are in a turn-on state, the first charging contactor CC1 and the second charging contactor CC2 are in a turn-off state.

More specifically, the control unit 130 calculates an internal resistance CR1 of the charger CS by using the battery current and the voltage applied between the first input terminal IT1 and the second input terminal IT2, and calculates a theoretical value of the measured voltage difference between the first measured voltage and the second measured voltage at the first connector condition and the first contactor condition by computing a distribution voltage of the charging voltage Vc and a battery voltage between the first measurement resistor MR1, the second measurement resistor MR2, the third measurement resistor MR3, the insulation resistance of the battery pack 100, and the internal resistance CR1.

After that, the control unit 130 sets the first reference voltage to be less than the calculated theoretical value of the measured voltage difference between the first measured voltage and the second measured voltage.

By doing so, the control unit 130 sets the first reference voltage corresponding to the insulation resistance of the battery pack 100 and the internal resistance CR1 of the charger CS connected to the battery pack 100, thereby accurately diagnosing a failure of the first charging contactor CC1.

If the first charging contactor CC1 is diagnosed as having a turn-on fault, the control unit 130 outputs a fault signal and stops charging.

Meanwhile, if a turn-on fault does not occur at the first charging contactor CC1, the control unit 130 controls only the first charging contactor CC1 into a turn-off state among the first charging contactor CC1 in a turn-on state and the second charging contactor CC2 in a turn-off state, and determines whether the first charging contactor CC1 has a turn-off fault based on the measured voltage difference between the first measured voltage and the second measured voltage.

Here, the turn-off fault may mean a fault that a contactor maintains a turn-on state even though the control unit 130 controls the contactor to turn off.

If the measured voltage difference is less than the first reference voltage, the control unit 130 may determine that a turn-off fault has occurred at the first charging contactor CC1.

If the first charging contactor CC1 is diagnosed as having a turn-off fault, the control unit 130 outputs a fault signal and stops charging.

Conversely, if the measured voltage difference is equal to or greater than the first reference voltage, the control unit 130 determines that a turn-off fault does not occur at the first charging contactor CC1.

Meanwhile, if a turn-on fault or a turn-off fault does not occur at the first charging contactor CC1, in order to diagnose a turn-on fault and a turn-off fault of the first charging contactor CC1, as shown in FIG. 1, the control unit 130 controls the first charging contactor CC1 into a turn-on state and then into a turn-off state, thereby changing the first charging contactor CC1 into a turn-off state.

After that, as shown in FIG. 3, the control unit 130 controls only the second charging contactor CC2 into a turn-on state among the first charging contactor CC1 and the second charging contactor CC2, and determine whether the second charging contactor CC2 has a turn-on fault based on the third measured voltage.

If the third measured voltage is equal to or greater than the second reference voltage, the control unit 130 may determine that the turn-on fault occurs at the second charging contactor CC2. Here, the third measured voltage may be an absolute value.

Conversely, if the third measured voltage is less than the second reference voltage, the control unit 130 may determine that a turn-on fault does not occur at the second charging contactor CC2.

At this time, the control unit 130 calculates a theoretical value of the third measured voltage corresponding to the case where the connector condition is the first connector condition described above and the contactor condition is a second contactor condition in which the first battery contactor BC1 and the second battery contactor BC2 are in the turn-on state and the first charging contactor CC1 and the second charging contactor CC2 are in the turn-off state.

More specifically, the control unit 130 calculates the internal resistance CR1 of the charger CS by using the battery current and the charging voltage Vc, and calculates a theoretical value of the third measured voltage at the first connector condition and the second contactor condition by computing a distribution voltage of the charging voltage Vc and a battery voltage among the first measurement resistor MR1, the second measurement resistor MR2, the third measurement resistor and the internal resistance CR1.

After that, the control unit 130 sets the second reference voltage to be less than the calculated theoretical value of the third measured voltage.

By doing so, the control unit 130 sets the second reference voltage corresponding to the internal resistance CR1 and the charging voltage Vc of the charger CS connected to the battery pack 100, thereby accurately diagnosing a fault of the second charging contactor CC2.

If the second charging contactor CC2 is diagnosed as having a turn-on fault, the control unit 130 outputs a fault signal and stops charging.

Meanwhile, the control unit 130 may selectively include a processor, an application-specific integrated circuit (ASIC), another chipset, a logic circuit, a register, a communication modem, a data processing device or the like in order to execute various control logics. At least one of the various control logics executable by the control unit 130 may be combined, and the combined control logic is written in a computer-readable code system and recorded on a computer-readable recording medium. The recording medium has no limitation as long as it can be accessed by the processor included in a computer. As one example, the recording medium includes at least one selected from the group consisting of a ROM, a RAM, a register, a CD-ROM, a magnetic tape, a hard disk, a floppy disk and an optical data recording device.

Hereinafter, a battery pack 100' according to another embodiment of the present disclosure will be described. In the battery pack 100' according to another embodiment of the present disclosure, some components may be further included and some components may have different functions, compared to the battery pack 100 according to the former embodiment of the present disclosure. Accordingly, the same features will not be described again.

Figure 4:
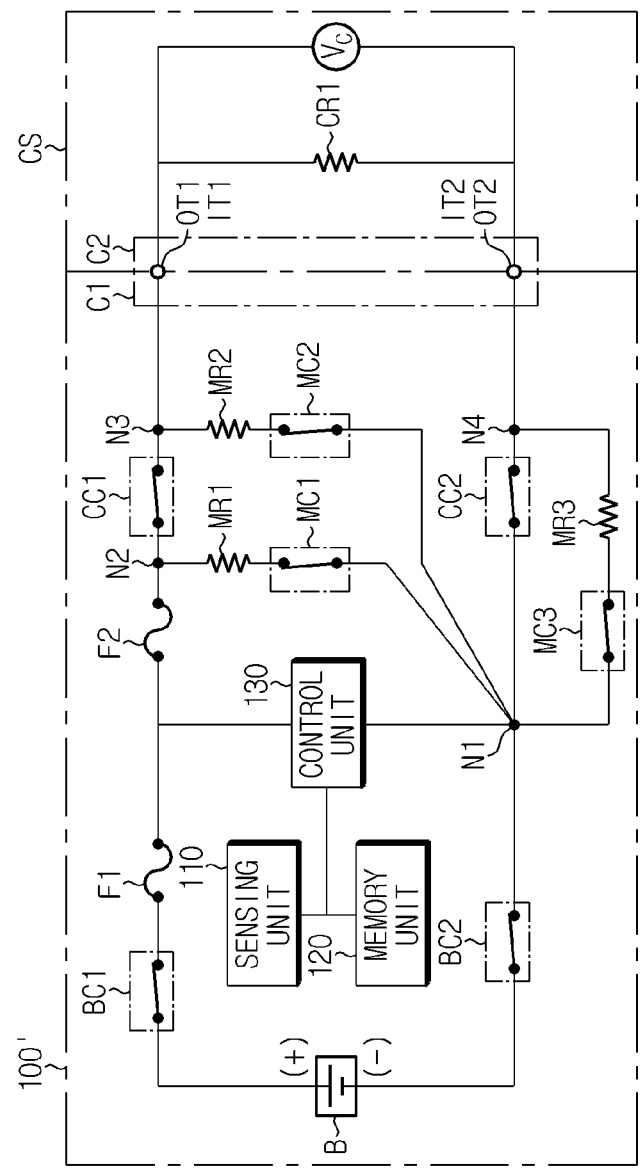
FIG. 4 is a diagram showing a functional configuration of a battery pack according to another embodiment of the present disclosure in a state where the battery pack is coupled to a charger.
Figure 5:
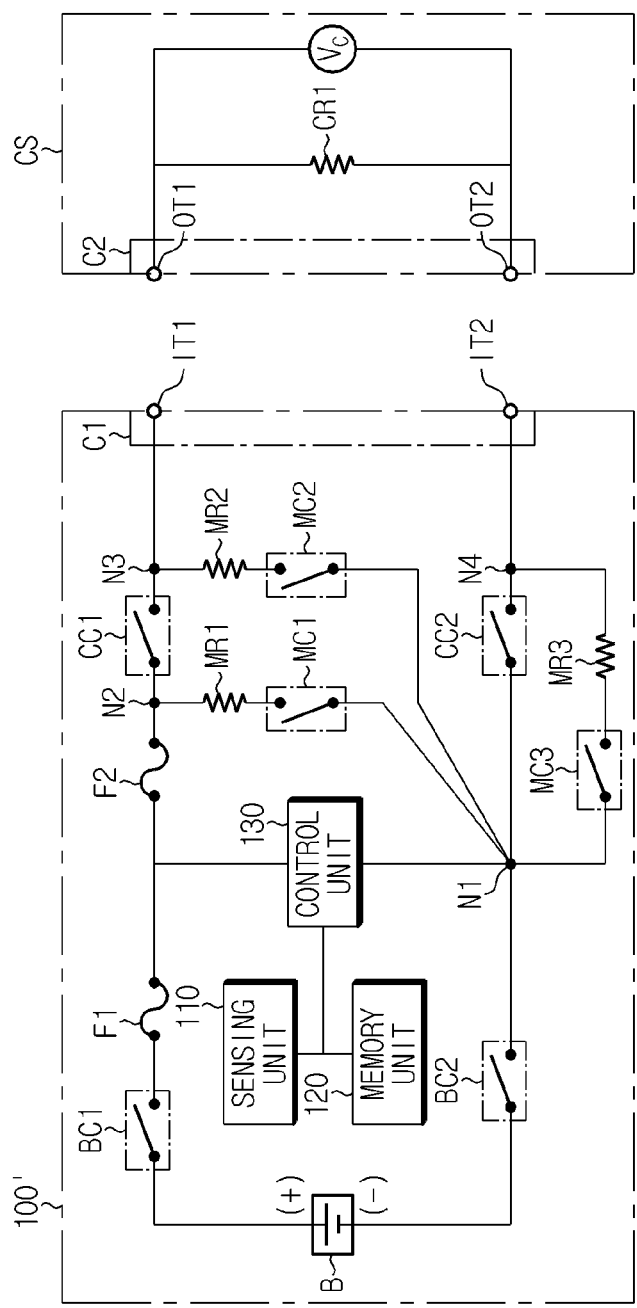
FIG. 5 is a diagram showing a functional configuration of the battery pack according to another embodiment of the present disclosure in a state where the battery pack is separated from the charger.

FIG. 4 is a diagram showing a functional configuration of the battery pack 100' according to another embodiment of the present disclosure in a state where the battery pack 100' is coupled to a charger CS, and FIG. 5 is a diagram showing a functional configuration of the battery pack 100' according to another embodiment of the present disclosure in a state where the battery pack 100' is separated from the charger CS.

Referring to FIG. 4, the battery pack 100' according to another embodiment of the present disclosure may further include a first measurement contactor MC1, a second measurement contactor MC2 and a third measurement contactor MC3, compared to the battery pack 100 according to the former embodiment of the present disclosure.

The first measurement contactor MC1 is electrically connected between the first measurement resistor MR1 and the first node N1. More specifically, one end of the first measurement resistor MR1 is electrically connected to the second node N2, and the other end of the first measurement resistor MR1 is electrically connected to one end of the first measurement contactor MC1. Subsequently, the other end of the first measurement contactor MC1 is electrically connected to the first node N1. That is, the first measurement resistor MR1 and the first measurement contactor MC1 are electrically connected in series between the first node N1 and the second node N2.

The second measurement contactor MC2 is electrically connected between the second measurement resistor MR2 and the first node N1. More specifically, one end of the second measurement resistor MR2 is electrically connected to the third node N3, and the other end of the second measurement resistor MR2 is electrically connected to one end of the second measurement contactor MC2. Subsequently, the other end of the second measurement contactor MC2 is electrically connected to the first node N1. That is, the second measurement resistor MR2 and the second measurement contactor MC2 are electrically connected in series between the first node N1 and the third node N3.

The third measurement contactor MC3 is electrically connected between the third measurement resistor MR3 and the first node N1. More specifically, one end of the third measurement resistor MR3 is electrically connected to the fourth node N4, and the other end of the third measurement resistor MR3 is electrically connected to one end of the third measurement contactor MC3. Subsequently, the other end of the third measurement contactor MC3 is electrically connected to the first node N1. That is, the third measurement resistor MR3 and the third measurement contactor MC3 are electrically connected in series between the first node N1 and the fourth node N4.

The measurement resistors MR1, . . . , MR3 described above may be resistors used to measure the voltage applied to the first charging contactor CC1 and the second charging contactor CC2. The measurement contactors MC1, . . . , MC3 electrically connected to the measurement resistors may serve to conduct or interrupt the current flowing through the measurement resistors.

The control unit 130 controls an operation state of at least one of the first measurement contactor MC1, the second measurement contactor MC2 and the third measurement contactor MC3 based on whether at least one of a charging start request signal and a charging end request signal is received.

Here, the charging start request signal and the charging end request signal may be signals output from an electronic control unit (ECU) of a vehicle that includes the battery pack according to the present disclosure.

In addition, if the charging start request signal is outputted from the ECU of the vehicle, as shown in FIG. 4, the first power connector C1 and the second power connector C2 of the charger CS may be in a coupled state in order to initiate charging.

If the charging start request signal is received, firstly, the control unit 130 controls the operation states of the first measurement contactor MC1, the second measurement contactor MC2 and the third measurement contactor MC3 to turn on. After that, the control unit 130 controls the operating states of the first charging contactor CC1 and the second charging contactor CC2 to turn on.

That is, if the charging start request signal is received, the control unit 130 controls the operation states of the first measurement contactor MC1, the second measurement contactor MC2 and the third measurement contactor MC3 to turn on before the operation states of the first charging contactor CC1 and the second charging contactor CC2 come into the turn-on state.

By doing so, the control unit 130 may monitor the voltage applied to the first charging contactor CC1 and the second charging contactor CC2 before a charging current is applied from the charger CS to the first charging contactor CC1 and the second charging contactor CC2.

Meanwhile, if the charging end request signal is output from an ECU of a vehicle, charging may be completed so that the first power connector C1 and the second power connector C2 of the charger CS may be in a state just before being separated.

Accordingly, if the charging end request signal is received, the control unit 130 receives firstly controls the operation state of the first charging contactor CC1 to turn off. After that, the control unit 130 controls the operation states of the first measurement contactor MC1 and the second measurement contactor MC2 based on a measurement voltage difference between the first measurement voltage and the second measurement voltage applied to the first measurement resistor MR1 and the second measurement resistor MR2, respectively.

More specifically, if the measurement voltage difference between the first measurement voltage and the second measurement voltage is equal to or greater than a preset first control voltage, the control unit 130 controls the operation states of the first measurement contactor MC1 and the second measurement contactor MC2 to turn off.

That is, if the charging end request signal is received, the control unit 130 controls the operation state of the first charging contactor CC1 to turn off, and if the operation state of the first charging contactor CC1 is controlled to turn off, the control unit 130 controls the operation states of the first measurement contactor MC1 and the second measurement contactor MC2 to turn off.

At this time, if the measurement voltage difference between the first measurement voltage and the second measurement voltage is equal to or greater than the preset first control voltage, the control unit 130 may control only the operation state of the second measurement contactor MC2 to turn off.

In this way, if the first power connector is separated from the second power connector of the charger as the control unit 130 completes charging as shown in FIG. 5, the control unit 130 may control the operation states of the first measurement contactor MC1 and the second measurement contactor MC2 to turn off so that no voltage is applied to the first input terminal IT1, thereby preventing a user from being electrically shocked by the first input terminal IT1 that may be exposed to the outside during the charging process.

Meanwhile, if the charging end request signal is received, the control unit 130 firstly controls the operation state of the second charging contactor CC2 to turn off. After that, the control unit 130 controls the operation state of the third measurement contactor MC3 based on the third measurement voltage applied to the third measurement resistor MR3.

More specifically, if the third measurement voltage is equal to or greater than the preset second control voltage, the control unit 130 controls the operation state of the third measurement contactor MC3 to turn off.

That is, if the charging end request signal is received, the control unit 130 controls the operation state of the second charging contactor CC2 to turn off, and if the operation state of the second charging contactor CC2 is controlled to turn off, the control unit 130 controls the operation state of the third measurement contactor MC3 to turn off.

In this way, if the first power connector is separated from the second power connector of the charger as the control unit 130 completes charging as shown in FIG. 5, the control unit 130 may control the operation state of the third measurement contactor MC3 to turn off so that no voltage is applied to the second input terminal IT2, thereby preventing a user from being electrically shocked by the second input terminal IT2 that may be exposed to the outside during the charging process.

Hereinafter, a battery pack 100" according to still another embodiment of the present disclosure will be described. In the battery pack 100" according to still another embodiment of the present disclosure, some components may be further included and some components may have different functions, compared to the battery pack 100' according to the former embodiment of the present disclosure. Accordingly, the same features will not be described again.

Figure 6:
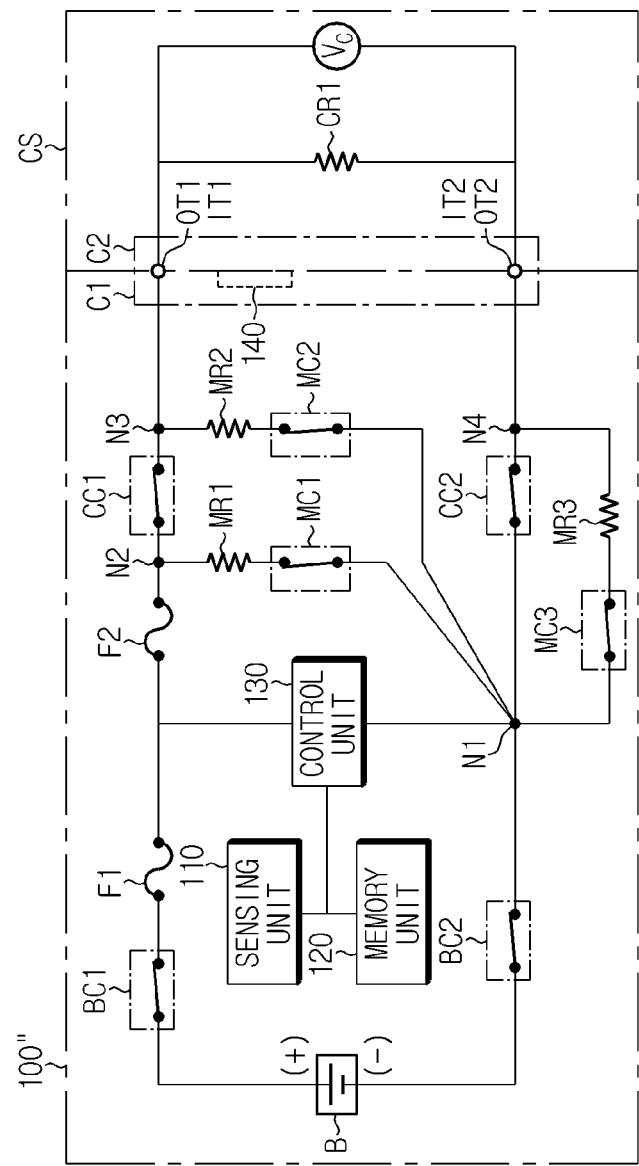
FIG. 6 is a diagram showing a functional configuration of a battery pack according to still another embodiment of the present disclosure in a state where the battery pack is coupled to a charger.
Figure 7:
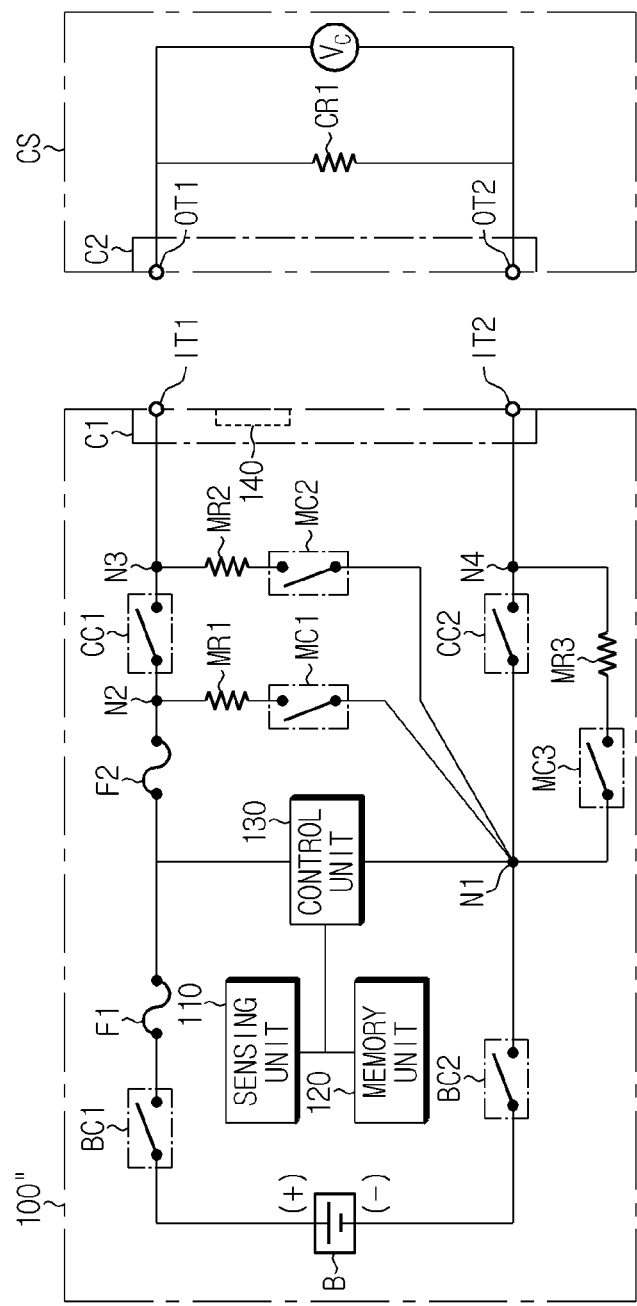
FIG. 7 is a diagram showing a functional configuration of the battery pack according to still another embodiment of the present disclosure in a state where the battery pack is separated from the charger.

FIG. 6 is a diagram showing a functional configuration of the battery pack 100" according to still another embodiment of the present disclosure in a state where the battery pack 100" is coupled to a charger CS, and FIG. 7 is a diagram showing a functional configuration of the battery pack 100" according to still another embodiment of the present disclosure in a state where the battery pack 100" is separated from the charger CS.

Referring to FIGS. 6 and 7, the battery pack 100" according to still another embodiment of the present disclosure may further include an illumination intensity sensing unit 140, compared to the battery pack 100' according to the former embodiment of the present disclosure.

The illumination intensity sensing unit 140 is installed at an inner side of the first power connector C1 to sense an illumination intensity around the first power connector C1.

More specifically, if the first power connector C1 and the second power connector C2 of the charger CS are coupled, the illumination intensity sensing unit 140 is installed on a surface of the first power connector C1 inside the space sealed by the first power connector C1 and the second power connector C2 of the charger CS.

Meanwhile, the first power connector C1 may include a connector cover.

At this time, if the connector cover is closed, the illumination intensity sensing unit 140 is installed on the surface of the first power connector C1 inside the inner space of the first power connector C1 and the space sealed by the connector cover.

That is, if the first power connector C1 is coupled to the second power connector C2 of the charger CS or the connector cover of the first power connector C1 is closed, the illumination intensity sensing unit 140 may be located in a sealed space into which no light is introduced, as shown in FIG. 6.

By using this, the control unit 130 compares the illumination intensity around the first power connector C1 measured by the illumination intensity sensing unit 140 with a preset reference illumination intensity, and controls the operation state of at least one of the first measurement contactor MC1, the second measurement contactor MC2 and the third measurement contactor MC3 based on the comparison result.

Here, the preset reference illumination intensity may be an illumination intensity value for determining whether the first input terminal IT1 and the second input terminal IT2 of the first power connector C1 are exposed to the outside.

More specifically, if the illumination intensity around the first power connector C1 measured by the illumination intensity sensing unit 140 is equal to or greater than the preset reference illumination intensity, as shown in FIG. 7, the control unit 130 determines that the first power connector C1 is separated from the second power connector C2 of the charger CS or the connector cover of the first power connector C1 is opened.

That is, if the illumination intensity around the first power connector C1 measured by the illumination intensity sensing unit 140 is equal to or greater than the preset reference illumination intensity, the control unit 130 determines that the first input terminal IT1 and the second input terminal IT2 of the first power connector C1 are exposed to the outside.

Conversely, if the illumination intensity around the first power connector C1 measured by the illumination intensity sensing unit 140 is smaller than the preset reference illumination intensity, as shown in FIG. 6, the control unit 130 determines that the first power connector C1 is coupled to the second power connector C2 of the charger CS or the connector cover of the first power connector C1 is closed.

That is, if the illumination intensity around the first power connector C1 measured by the illumination intensity sensing unit 140 is smaller than the preset reference illumination intensity, the control unit 130 determines that the first input terminal IT1 and the second input terminal IT2 of the first power connector C1 are not exposed to the outside.

After that, if the illumination intensity around the first power connector C1 measured by the illumination intensity sensing unit 140 is equal to or greater than the preset reference illumination intensity, the control unit 130 controls the operation states of the first measurement contactor MC1, the second measurement contactor MC2 and the third measurement contactor MC3 to turn off.

In addition, if the illumination intensity around the first power connector C1 measured by the illumination intensity sensing unit 140 is equal to or greater than the preset reference illumination intensity, the control unit 130 controls the operation states of the first charging contactor CC1 and the second charging contactor CC2 to turn off.

By doing so, if the first input terminal IT1 and the second input terminal IT2 of the first power connector C1 are exposed to the outside, the control unit 130 controls the operation states of the first measurement contactor MC1, the second measurement contactor MC2 and the third measurement contactor MC3 to turn off, thereby preventing an accident that a user is electrically shocked by the first input terminal IT1 or the second input terminal IT2 exposed to the outside.

Meanwhile, a vehicle according to the present disclosure may include the battery pack according to the present disclosure described above.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A battery pack, comprising:
a first battery contactor, wherein a first end of the first battery contactor is configured to be electrically connected to a positive electrode terminal of a battery;
a second battery contactor, wherein a first end of the second battery contactor is configured to be electrically connected to a negative electrode terminal of the battery;
a first charging contactor, wherein a first end of the first charging contactor is electrically connected to a second end of the first battery contactor;
a second charging contactor, wherein a first end of the first charging contactor is electrically connected to a second end of the second battery contactor;
a first measurement resistor electrically connected between a first node located at the first end of the second charging contactor and a second node located at the first end of the first charging contactor;
a second measurement resistor electrically connected between the first node and a third node located at a second end of the first charging contactor;
a third measurement resistor electrically connected between the first node and a fourth node located at a second end of the second charging contactor;
a first power connector having:
a first input terminal electrically connected to the second end of the first charging contactor; and
a second input terminal electrically connected to the second end of the second charging contactor; and
a control unit configured to, when first and second output terminals of a second power connector of a charger are electrically connected to the first input terminal and the second input terminal of the first power connector, respectively, and a charging voltage is being applied from a power source of the charger to the battery pack between the first output terminal and the second output terminal:

control at least one of the first charging contactor or the second charging contactor to change from a turn-on state to a turn-off state; and diagnose a fault of each of the first charging contactor and the second charging contactor based on at least one of a first measured voltage measured across the first measurement resistor, a second measured voltage measured across the second measurement resistor or a third measured voltage measured across the third measurement resistor.

2. The battery pack according to claim 1, wherein when a charging start request signal is received, the control unit is configured to:

control the first charging contactor to change from the turn-off state to the turn-on state; and determine whether the first charging contactor has a turn-on fault based on a measured voltage difference between the first measured voltage and the second measured voltage that are measured while the first charging contactor is in the turn-on state.

3. The battery pack according to claim 2, wherein when the measured voltage difference is equal to or greater than a first reference voltage, the control unit is configured to determine that a turn-on fault occurs at the first charging contactor.

4. The battery pack according to claim 1, wherein when a charging start request signal is received, the control unit is configured to:

control the first charging contactor to change from the turn-on state to the turn-off state; and determine whether the first charging contactor has a turn-off fault based on a measured voltage difference between the first measured voltage and the second measured voltage that are measured while the first charging contactor is in the turn-off state.

5. The battery pack according to claim 4, wherein when the measured voltage difference is less than a first reference voltage, the control unit is configured to determine that a turn-off fault occurs at the first charging contactor.

6. The battery pack according to claim 1, wherein when a charging start request signal is received, the control unit is configured to:

determine whether the first charging contactor has a fault based on a measured voltage difference between the first measured voltage and the second measured voltage; and when it is determined that the first charging contact does not have a fault:

control the second charging contactor to change from the turn-off state to the turn-on state; and determine whether the second charging contactor has a turn-on fault based on the third measured voltage that is measured while the second charging contactor is in the turn-on state.

7. The battery pack according to claim 6, wherein when the third measured voltage is equal to or greater than a second reference voltage, the control unit is configured to determine that a turn-on fault occurs at the second charging contactor.

8. The battery pack according to claim 1, wherein when it is determined that a fault occurs in at least one of the first charging contactor and the second charging contactor, the control unit is configured to stop charging the battery from the power source of the charger.

9. A vehicle, comprising a battery pack according to claim 1.

* * * * *